United States Patent
Wu et al.

(10) Patent No.: US 9,823,295 B2
(45) Date of Patent: Nov. 21, 2017

(54) BATTERY SIMULATOR

(71) Applicant: CHROMA ATE INC., Taoyuan (TW)

(72) Inventors: Chien-Ming Wu, Taoyuan (TW);
Ming-Ying Tsou, Taoyuan (TW);
Kuan-Hung Wu, Taoyuan (TW);
Kun-Che He, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 15/092,290

(22) Filed: Apr. 6, 2016

(65) Prior Publication Data

US 2016/0341787 A1 Nov. 24, 2016

(30) Foreign Application Priority Data

May 20, 2015 (TW) .............................. 104116108 A

(51) Int. Cl.
*G01R 31/28* (2006.01)
*G01R 31/36* (2006.01)

(52) U.S. Cl.
CPC ...... *G01R 31/2846* (2013.01); *G01R 31/3631* (2013.01)

(58) Field of Classification Search
CPC ............ G01R 31/2846; G01R 31/3662; G01R 31/3627; G01R 31/40; G01N 17/00; G01V 3/08; H01L 41/09

USPC .. 324/750.01, 500, 426–433, 537, 520, 522, 324/764.01, 600, 616
See application file for complete search history.

(56) References Cited

U.S. PATENT DOCUMENTS

2006/0279288 A1* 12/2006 Klang ................ G01R 31/3631
324/426
2011/0279079 A1* 11/2011 Do Valle ................... H02J 7/04
320/107

* cited by examiner

*Primary Examiner* — Melissa Koval
*Assistant Examiner* — Trung Nguyen
(74) *Attorney, Agent, or Firm* — Maschoff Brennan

(57) ABSTRACT

A battery simulator for simulating the status of a battery connected to a load component includes a controllable current source, a voltage detector, and a gain controller. The controllable current source supplies an output current to the load component according to a current control signal. The voltage detector measures a detection voltage that is generated in response to the output current flowing through the load component. The gain controller is electrically connected to the controllable current source and the voltage detector and generates the current control signal according to a voltage control signal, a gain control signal and the detection voltage.

10 Claims, 2 Drawing Sheets

BATTERY SIMULATOR

CROSS-REFERENCE TO RELATED APPLICATIONS

This non-provisional application claims priority under 35 U.S.C. §119(a) on Patent Application No(s). 104116108 filed in Taiwan, R.O.C. on May 20, 2015, the entire contents of which are hereby incorporated by reference.

BACKGROUND

Technical Field

The disclosure relates to a simulator, more particularly to a battery simulator.

Related Art

Recently, to test electronic devices, they are usually connected to a power supply, and the power supply supplies rated voltages or currents to these electronic devices. However, a battery actually has an internal resistor. When a load component is drawing a current from the battery, the voltage difference between the two ends of the load component is related to the rated current of the battery and the drawn current. Therefore, it is insufficient to employ only the power supply to power electronic devices in the test process. For this, each electronic device to be tested is usually connected to a real battery in order to check the actual state of the electronic device in use. However, a different type of electronic device requires a different type of battery, and the same type of electronic device also requires multiple same batteries in their test process. It is not easy to fulfill such a requirement.

SUMMARY

In the test process of electronic devices, it is insufficient to employ only a power supply to power the electronic devices in the test process, and it is not easy to employ real batteries to power these electronic devices. Therefore, the disclosure provides a battery simulator for simulating that real batteries are powering load components (electronic devices to be tested).

According to one of embodiments, the disclosure provides a battery simulator for simulating a state of a battery connected to a load component. The battery simulator includes a controllable current source, a voltage detector and a gain controller. The controllable current source supplies an output current to the load component according to a current control signal. The voltage detector may measure a detection voltage that is generated in response to the output current flowing through the load component. The gain controller is electrically connected to the controllable current source and the voltage detector. The gain controller may generate the current control signal according to the voltage control signal, the gain control signal and the detection voltage.

According to another of embodiments, the disclosure provides a battery simulator for simulating a state of a battery connected to a load component. The battery simulator includes a controllable current source, a voltage detector and a gain controller. The controllable current source supplies an output current to the load component according to a current control signal. The voltage detector may measure a detection voltage that is generated in response to the output current flowing through the load component, and generate a voltage difference between the detection voltage and a voltage control signal. The gain controller is electrically connected to the controllable current source and the voltage detector. The gain controller may generate the current control signal according to the gain control signal and the voltage difference.

As described above the output current that is supplied to the load component by the battery simulator, is decided by the output voltage applied to the load component, a related voltage defined by the voltage control signal, and the gain control signal used to define the internal resistor of the simulated battery. Therefore, the battery simulator in the disclosure may simulate the state of the output current and the state of the load voltage when the battery is powering the load component.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
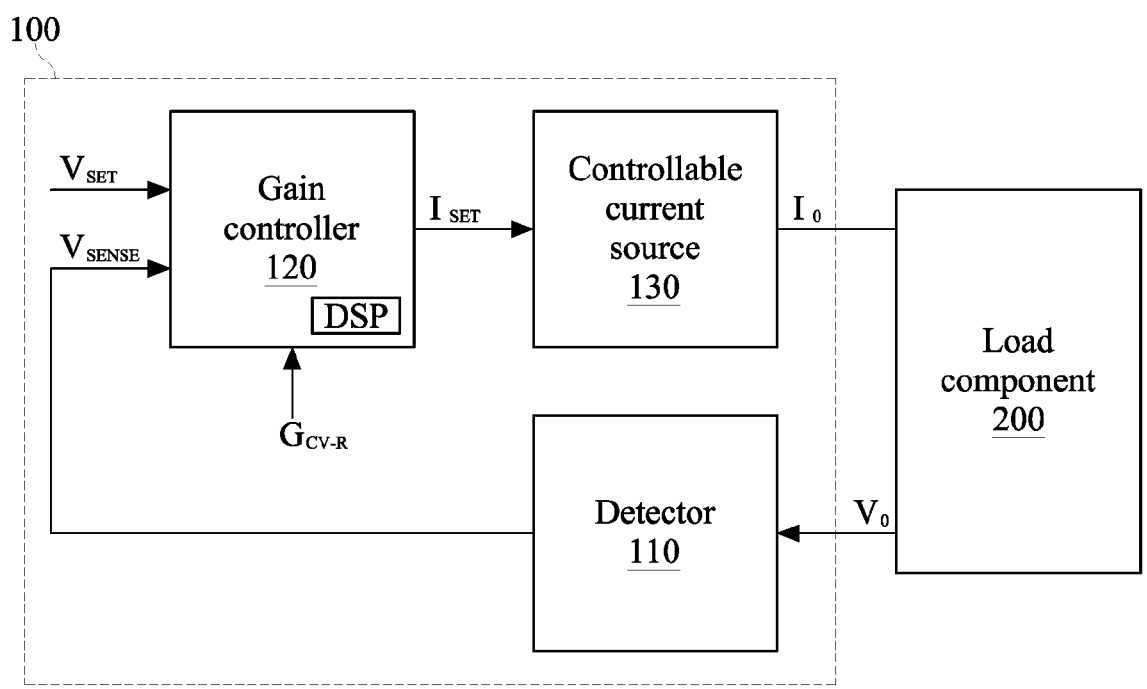
FIG. 1 is a block diagram of a battery simulator and a load component in an embodiment.

The disclosure relates to a battery simulator for simulating a battery used by a load component. Please refer to FIG. 1. FIG. 1 is a block diagram of a battery simulator and a load component in an embodiment. A battery simulator 100 includes a voltage detector 110, a gain controller 120 and a controllable current source 130. The gain controller 120 is electrically connected to the voltage detector 110, and the controllable current source 130 is electrically connected to the gain controller 120.

The voltage detector 110 measures a detection voltage $V_{SENSE}$ that is generated in response to an output current $I_O$ flowing through a load component 200. In an embodiment, when the output current $I_O$ is flowing through the load component 200, the voltage detector 110 converts the voltage difference between the two terminals of the load component 200, i.e. an output voltage $V_O$, into a digital signal, i.e. the detection voltage $V_{SENSE}$.

The gain controller 120 generates a current control signal $I_{SET}$ according to a voltage control signal $V_{SET}$, the detection voltage $V_{SENSE}$ and a gain control signal $G_{CV-R}$. In an embodiment, the DC gain $G_{DC}$ of the gain controller 120 is controlled by the gain control signal $G_{CV-R}$. The gain control signal $G_{CV-R}$ herein is defined by the internal resistor of the battery simulated by the battery simulator 100. For example, if the internal resistor of a battery to be simulated is 10 ohms, the DC gain $G_{DC}$ indicated by the gain control signal $G_{CV-R}$ will be 0.1 ampere/volt. The current control signal $I_{SET}$ herein is defined by the detection voltage $V_{SENSE}$, the voltage control signal $V_{SET}$ and the gain control signal $G_{CV-R}$. More particularly, in an embodiment, the output current $I_O$ corresponding to the current control signal $I_{SET}$ is expressed as follows:

$$I_O = G_{DC} \times (V_{SET} - V_{SENSE}) \quad (1)$$

In an embodiment with respect to the Formula (1), the current control signal $I_{SET}$ is defined by the current voltage control signal $V_{SET}$ and the current detection voltage $V_{SENSE}$. In another embodiment, the gain frequency response G(f) of the gain controller 120 is defined by the electrochemical property of the battery. In other words, the gain frequency response G(f) is used to illustrate the equivalent circuit of the internal impedance of a battery in simulation when the battery is connected to a digital circuit and the current drawn from the battery changes fast. The output current $I_O$ corresponding to the current control signal $I_{SET}$ is expressed as follows:

$$I_O = G(f) \times (V_{SET} - V_{SENSE}) \quad (2)$$

In other words, in some embodiments, the current control signal $I_{SET}$ is more related to the previous variability of the detection voltage $V_{SENSE}$ and the previous variability of the voltage control signal $V_{SET}$. In above embodiments, the voltage control signal $V_{SET}$ and the current control signal $I_{SET}$ are digital signals, and the gain controller 120 includes a digital signal processor (DSP). The digital signal processor herein is a complex programmable logic device (CPLD), a field programmable gate array (FPGA), an 8051 chip or another electronic component capable of processing digital signals. In another embodiment, the voltage control signal $V_{SET}$ and the current control signal $I_{SET}$ are analog signals, and the gain controller 120 is, for example, an analog gain controllable circuit, which is controlled by the gain control signal.

The controllable current source 130 supplies an output current $I_O$ to the load component 200 according to the current control signal $I_{SET}$. In an embodiment, the so-called output current $I_O$ may flow to the load component 200 from the controllable current source 130, or may flow from the load component 200 to a power source through the controllable current source 130. More particularly, in an embodiment, if the battery simulator 100 is merely used to simulate the performance of a battery that is supplying power, the controllable current source 130 will include a set of current sources. The set of current sources herein is embodied by, for example, but not limited to, multiple constant current sources or a single bidirectional current source.

In another embodiment, if the battery simulator 100 is used to simulate the performance of a battery that is being charged, the controllable current source 130 will include a set of current sinks. The set of current sinks herein is embodied by, for example, but not limited to, a single bidirectional current sink or multiple constant current sinks. When constant current sinks are used to carry out a set of current sinks, each constant current sink is selectively enabled or disabled by the current control signal $I_{SET}$. After the controllable current source 130 is connected to the load component 200, each constant current sink will draw a constant quantity of current from the load component 200 when being enabled. Herein, the quantities of current drawn by any two of the constant current sources are the same or are different when they are enabled, and the disclosure will not be limited thereto. In an embodiment, the current source is embodied by drawing a current from an external power source (e.g. mains electricity or an external power supply) and supplying to the load component 200, and the current sink is embodied by drawing a current from the load component 200 and sending it back to the external power source.

In yet another embodiment, the controllable current source 130 includes a set of digital current sources and a set of digital current sinks and may be used to simulate a battery that is supplying power or is being charged. That is, the controllable current source 130 is a bidirectional current source capable of supplying a current to the load component 200 and drawing a current from the load component 200.

Figure 2:
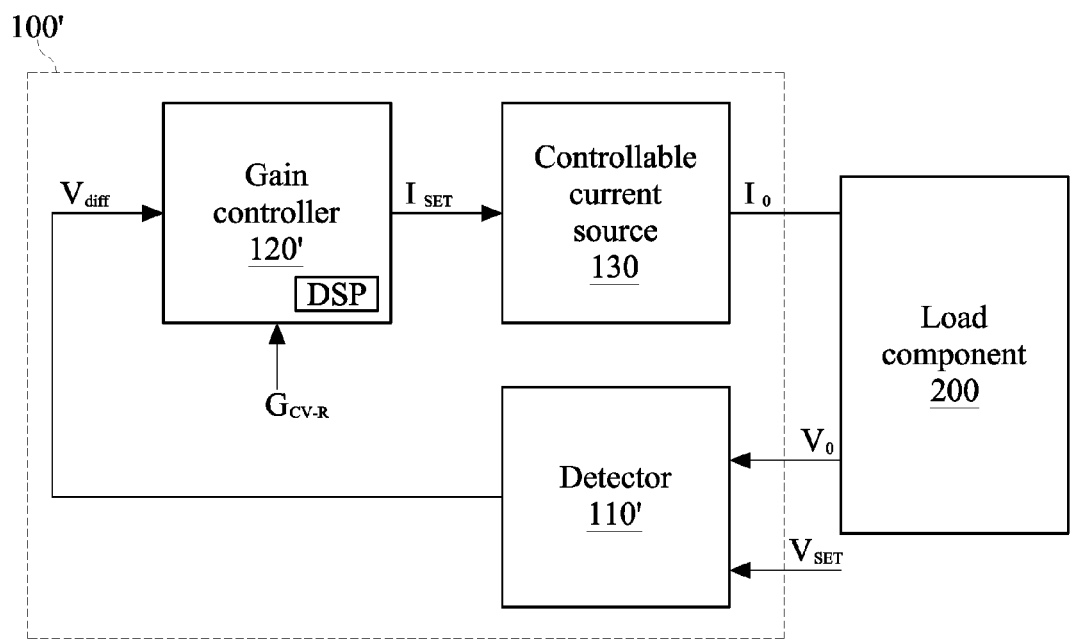
FIG. 2 is a block diagram of a battery simulator and a load component in another embodiment.

Please refer to FIG. 2, which is a block diagram of a battery simulator and a load component in another embodiment. As shown in FIG. 2, as compared to the battery simulator 100 in FIG. 1, the voltage detector 110' in the battery simulator 100' generates a voltage difference signal $V_{diff}$ according to the output voltage $V_O$ corresponding to the output current $I_O$ flowing through the load component 200, and the voltage control signal $V_{SET}$, the gain controller 120' generates the current control signal $I_{SET}$ according to the voltage difference signal $V_{diff}$ and the gain control signal $G_{CV-R}$. The output current $I_O$ corresponding to the current control signal $I_{SET}$ may be expressed as follows:

$$I_O = G_{CV-R} \times V_{diff} \quad (3)$$

In this embodiment, the voltage control signal $V_{SET}$ indicates a rated voltage value. That is, this embodiment assumes that the negative end of the load component 200 has the same voltage potential as the negative end of a battery to be simulated, and this embodiment also employs the voltage detector 110 to measure the voltage control signal $V_{SET}$ outputted by an ideal DC voltage source in the battery to be simulated and measure the output voltage $V_O$ on the positive end of the load in order to produce the voltage difference signal $V_{diff}$.

Figure 3:
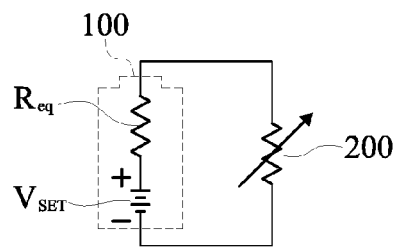
FIG. 3 is an equivalent circuit diagram with respect to FIG. 1 or FIG. 2.

Because the output current $I_O$ is defined by the gain control signal $G_{CV-R}$, the output voltage $V_O$ and the voltage control signal $V_{SET}$, the battery simulator in use in the above embodiments has an equivalent circuit, as shown in FIG. 3. FIG. 3 is an equivalent circuit diagram with respect to FIG. 1 or FIG. 2. In FIG. 3, the battery simulator 100 is the equivalent to a current source as well as a battery, the current source has the current control signal $V_{SET}$, and the internal resistor Req in the battery is connected to the current source in series. The resistance of the internal resistor Req is substantially equal to the reciprocal of the gain control signal $G_{CV-R}$.

In practice, a circuit designer attempts to simulate that a battery, which has a constant voltage of 25 V and an internal resistor of 0.2 ohms, is powering the load component 200 in a simulated environment, the voltage indicated by the voltage control signal $V_{SET}$ is 25 V, and the gain indicated by the gain control signal $G_{CV-R}$ is 5 A/V. When the load component 200 requires a current of 1 A provided by the battery simulator 100, and the output current $I_O$ supplied to the load component 200 by the battery supplies, is smaller than 1 A, the output voltage $V_O$ will be dropped low. Therefore, the output current $I_O$ then increases. Once the output voltage $V_O$ is substantially equal to 24.8 V, the output current $I_O$ may be 1 A, and the entire simulation system progressively stabilizes.

Then, if the load component 200 draws out a current of 10 A from the battery simulator 100, the output voltage $V_O$ will immediately be dropped low because the output current $I_O$ herein is only 1 A. Therefore, the output current $I_O$ increases in response. When the output voltage $V_O$ is substantially equal to 23 V and the output current $I_O$ is 10 A, the entire simulation system progressively stabilizes. In another embodiment, if the gain controller 120 in the battery simulator 100 defines a gain frequency response G(f) that is not constant and is a low-pass frequency response, the battery simulator 100 may be used to simulate a battery in which one or more inductive elements are embedded.

On the other hand, a circuit designer attempts to simulate that a battery, whose constant voltage is 25 V and whose internal resistor is 0.2 ohms, is charged in a simulated environment, the voltage indicated by the voltage control signal $V_{SET}$ is 25 V, and the gain indicated by the gain control signal $G_{CV-R}$ is 5 A/V. When the charging voltage (i.e. the output voltage $V_O$) provided by the battery simulator 100 is 26 V, the output current $I_O$ corresponding to the current control signal $I_{SET}$ will be −5 A. That is, the battery simulator 100 may draw a 5 A current from its charging device.

If a charging voltage (i.e. the output voltage $V_O$) supplying to the battery simulator 100 is 30 V, the output current $I_O$ corresponding to the current control signal $I_{SET}$ may be −25 A, which indicates that the battery simulator 100 may draw a 25 A current from its charging device.

Accordingly, the output current supplied to the load component by the battery simulator is defined by the output voltage obtained by the load component, the rated voltage indicated by the voltage control signal, and the gain control signal for defining the internal resistor of a battery to be simulated. Therefore, the battery simulator in the above embodiments may be able to simulate the current state and voltage state of the battery when the battery is powering a load component, and/or when a charging device is charging the battery.

What is claimed is:

1. A battery simulator for simulating a state of a battery connected to a load component, the battery simulator comprising:
   a controllable current source configured to supply an output current to the load component according to a current control signal;
   a voltage detector configured to measure a detection voltage that is generated in response to the output current flowing through the load component; and
   a gain controller electrically connected to the controllable current source and the voltage detector and configured to generate the current control signal according to a voltage control signal, a gain control signal and the detection voltage,
   wherein a gain frequency response of the gain controller is based on an electrochemical property of the battery, and the gain control signal is set based on an internal resistor of the battery.

2. The battery simulator according to claim 1, wherein a DC gain of the gain controller is controlled by the gain control signal.

3. The battery simulator according to claim 2, wherein the output current corresponding to the current control signal is substantially equal to the product of the DC gain and a voltage difference between the detection voltage and the voltage control signal.

4. The battery simulator according to claim 1, wherein the current control signal is a digital signal, and the gain controller comprises a digital signal processor.

5. The battery simulator according to claim 1, wherein the controllable current source is a bidirectional current source.

6. A battery simulator for simulating a state of a battery connected to a load component, the battery simulator comprising:
   a controllable current source configured to supply an output current to the load component according to a current control signal;
   a voltage detector configured to measure a voltage difference between a detection voltage and a voltage control signal when the output current flows through the load component; and
   a gain controller electrically connected to the controllable current source and the voltage detector and configured to generate the current control signal according to a gain control signal and the voltage difference,
   wherein a gain frequency response of the gain controller is based on an electrochemical property of the battery, and the gain control signal is generated according to an internal resistor of the battery.

7. The battery simulator according to claim 6, wherein a DC gain of the gain controller is controlled by the gain control signal.

8. The battery simulator according to claim 7, wherein the output current corresponding to the current control signal is substantially equal to the product of the voltage difference and the DC gain.

9. The battery simulator according to claim 6, wherein the current control signal is a digital signal, and the gain controller comprises a digital signal processor.

10. The battery simulator according to claim 6, wherein the controllable current source is a bidirectional current source.

* * * * *